United States Patent
Sun et al.

(10) Patent No.: US 11,070,172 B2
(45) Date of Patent: Jul. 20, 2021

(54) METHOD AND DEVICE FOR REDUCING POWER CONSUMPTION OF PA

(71) Applicant: HUAWEI TECHNOLOGIES CO., LTD., Guangdong (CN)

(72) Inventors: Liguo Sun, Xi'an (CN); Shudong Huo, Xi'an (CN); Xuewei Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/711,108

(22) Filed: Dec. 11, 2019

(65) Prior Publication Data

US 2020/0119696 A1 Apr. 16, 2020

Related U.S. Application Data

(63) Continuation of application No. PCT/CN2017/087974, filed on Jun. 12, 2017.

(51) Int. Cl.
*H03F 1/02* (2006.01)
*H03F 3/195* (2006.01)
(Continued)

(52) U.S. Cl.
CPC ........... *H03F 1/0233* (2013.01); *H03F 3/195* (2013.01); *H03F 3/245* (2013.01); *H04W 52/241* (2013.01)

(58) Field of Classification Search
CPC ........ H03F 1/0233; H03F 3/195; H03F 3/245; H03F 1/02; H03F 3/24; H04W 52/241; H04W 52/24; H04L 1/0001
(Continued)

(56) References Cited

U.S. PATENT DOCUMENTS

| 7,792,505 B2 | 9/2010 | Mueller et al. | |
| 8,165,642 B2* | 4/2012 | Dimpflmaier | H03F 1/0211 455/572 |

(Continued)

FOREIGN PATENT DOCUMENTS

| CN | 101404638 A | 4/2009 |
| CN | 101888263 A | 11/2010 |

(Continued)

OTHER PUBLICATIONS

PCT International Search Report and Written Opinion in International Application No. PCT/CN2017/087974 dated Mar. 8, 2018, 16 pages (With English Translation).

(Continued)

*Primary Examiner* — Ankur Jain
(74) *Attorney, Agent, or Firm* — Fish & Richardson P.C.

(57) ABSTRACT

Embodiments of the present invention disclose a method and a device for reducing power consumption of a PA, and relate to the field of communications technologies, which can reduce the power consumption of the PA to a maximum extent for components of different batches. A detailed solution is as follows: The station A receives a first link status indication sent by a station B, where the first link status indication includes a parameter of a status of a link from the station A to the station B; and if the parameter included in the first link status indication is greater than a first threshold, the station A decreases a drain voltage of the PA, to reduce the power consumption of the PA. The embodiments of the present invention are applied to a process of communication between point-to-point radio frequency modules.

16 Claims, 6 Drawing Sheets

---

A station A receives a first link status indication sent by a station B — S301

If a parameter included in the first link status indication is greater than a first threshold, the station A decreases a drain voltage of a PA, to reduce power consumption of the PA — S302

(51) Int. Cl.
*H03F 3/24* (2006.01)
*H04W 52/24* (2009.01)

(58) Field of Classification Search
USPC ..................................................... 455/127.5
See application file for complete search history.

(56) References Cited

U.S. PATENT DOCUMENTS

| | | | |
|---|---|---|---|
| 8,873,457 B2* | 10/2014 | Perraud | H04W 52/0245 370/318 |
| 9,369,161 B1 | 6/2016 | Chukka et al. | |
| 2010/0291975 A1 | 11/2010 | Dimpflmaier et al. | |
| 2010/0321108 A1 | 12/2010 | Lee et al. | |
| 2011/0059691 A1 | 3/2011 | Hegge | |
| 2013/0135053 A1* | 5/2013 | Tamanoi | H03F 3/21 330/296 |
| 2014/0321294 A1* | 10/2014 | Nagel | H04L 43/08 370/252 |
| 2014/0323174 A1* | 10/2014 | Milotta | H04W 52/16 455/522 |
| 2015/0173027 A1 | 6/2015 | Zhang et al. | |

FOREIGN PATENT DOCUMENTS

| | | |
|---|---|---|
| CN | 102685858 A | 9/2012 |
| CN | 104412667 A | 3/2015 |
| EP | 2251975 A1 | 11/2010 |
| JP | H08191224 A | 7/1996 |

OTHER PUBLICATIONS

Extended European Search Report and Written Opinion issued in European Application No. 17913608.0 dated Jun. 3, 2020, 8 pages.
Office Action issued in Chinese Application No. 201780091828.4 dated May 29, 2020, 19 pages (with English translation).

* cited by examiner

METHOD AND DEVICE FOR REDUCING POWER CONSUMPTION OF PA

CROSS-REFERENCE TO RELATED APPLICATIONS

This application is a continuation of International Application No. PCT/CN2017/087974, filed on Jun. 12, 2017, the disclosure of which is hereby incorporated by reference in its entirety.

TECHNICAL FIELD

Embodiments of the present invention relate to the field of communications technologies, and in particular, to a method and a device for reducing power consumption of a PA.

BACKGROUND

A radio frequency module of a communications device includes a power amplifier (PA), and the PA has a signal power amplification characteristic.

Currently, the PA is usually biased in a relatively wide operating area to ensure linearity of the PA. In this case, static power consumption of the PA is very high, and power consumption of the PA accounts for a relatively large proportion in power consumption of the communications device. In addition, in the communications device, most modules other than the PA are highly integrated radio frequency integrated circuits, and power consumption of the modules cannot be adjusted and optimized much more due to design constraints of functions and performance. Therefore, to save energy and reduce emission and improve product competitiveness, the power consumption of the PA in the radio frequency module may be reduced on the premise that product performance is ensured, thereby reducing the power consumption of the communications device.

In the prior art, transmit powers of the PA in the radio frequency module may have three levels: high, medium, and low, and different drain bias currents are provided based on the high, medium, and low transmit powers, to properly adjust the power consumption of the PA in the radio frequency module based on the different transmit powers. In addition, to ensure reliability of a communications transmission system, performance of the PA and peak-to-average ratio backoff at a maximum transmit power need to be ensured. Therefore, a drain voltage of the PA needs to keep at a bias value of the maximum transmit power.

However, in the prior art, when the maximum transmit power is not required in the communications transmission system, the drain voltage of the PA still needs to keep at a maximum value, and therefore the power consumption of the PA is still high. In addition, because the transmit powers have a limited quantity of levels, and individual differences between batches of components in the radio frequency module need to be considered, drain current design redundancy and unnecessary power consumption are caused.

SUMMARY

This application provides a method and a device for reducing power consumption of a PA, which can reduce the power consumption of the PA to a maximum extent for components of different batches.

To achieve the foregoing objective, the following technical solutions are used in this application.

A first aspect of this application provides a method for reducing power consumption of a PA, where a station A includes the PA, and the method in this application may include: receiving, by the station A, a first link status indication from a station B, where the first link status indication includes a parameter of a status of a link from the station A to the station B; and if the parameter included in the first link status indication is greater than a first threshold, decreasing, by the station A, a drain voltage of the PA, to reduce the power consumption of the PA. In this application, the station A may decrease the drain voltage of the PA based on the received first link status indication, to reduce the power consumption of the PA. The first link status indication is used to represent quality of a link status, when the parameter included in the first link status indication is greater than the first threshold, the station A decreases the drain voltage of the PA, so that the power consumption of the PA may further be reduced when reliability of a communications system is ensured. In addition, the station A may monitor a link status of the communications system in real time, and therefore when the reliability of the communications system is ensured, and for components of different batches at different transmit powers, the station A may decrease the drain voltage of the PA to a maximum extent, to reduce the power consumption of the PA to a maximum extent by using the link status monitored in real time.

With reference to the first aspect, in a possible implementation of this application, the first link status indication includes any one of a mean square error (MSE), an error vector magnitude (EVM), and a signal-to-noise ratio (SNR). The any one of the MSE, the EVM, and the SNR may represent quality of a link status during signal transmission.

With reference to the first aspect and the foregoing possible implementation, in another possible implementation of this application, the station A may periodically receive a link status indication from the station B, and monitor quality of the status of the link from the station A to the station B in real time. The station A may determine, based on the periodically received link status indication, whether to continue to decrease the drain voltage of the PA. The method in this application may further include: receiving, by the station A, a second link status indication from the station B, where the second link status indication includes the parameter of the status of the link from the station A to the station B, and if the parameter included in the second link status indication is less than the first threshold and greater than a second threshold (the second threshold is less than the first threshold), stopping decreasing, by the station A, the drain voltage of the PA. The station A may monitor the quality of the link status in real time in a process of decreasing the drain voltage of the PA, so that the parameter included in the second link status indication is always between the first threshold and the second threshold. Therefore, the drain voltage of the PA may be decreased to a maximum extent, to reduce the power consumption of the PA to a maximum extent when the reliability of the communications system is ensured.

With reference to the first aspect and the foregoing possible implementations, in another possible implementation of this application, when the parameter included in the first link status indication received by the station A is less than a second threshold, it indicates that the quality of the link status during signal transmission between the station A and the station B is relatively poor. To ensure normal signal transmission, the station A may increase the drain voltage of the PA. The method in this application may further include: If the parameter included in the first link status indication is less than a second threshold, increasing, by the station A, the drain voltage of the PA, where the second threshold is less than the first threshold. After the station A increases the drain voltage of the PA, it can be ensured that the parameter included in the received first link status indication is greater than the second threshold. Therefore, after the station A increases the drain voltage of the PA, the reliability of the communications system is ensured.

With reference to the first aspect and the foregoing possible implementations, in another possible implementation of this application, the station A may determine, based on the periodically received link status indication, whether to continue to increase the drain voltage of the PA. The method in this application may further include: receiving, by the station A, a third link status indication sent by the station B, where the third link status indication includes the parameter of the status of the link from the station A to the station B; and if the parameter included in the third link status indication is greater than the second threshold and less than the first threshold, stopping increasing the drain voltage of the PA. After the station A increases the drain voltage of the PA, the parameter included in the third link status indication is greater than the second threshold and less than the first threshold. Therefore, in this method provided in this embodiment of the present invention, not only the reliability of the communications system is ensured, but also a problem of excessive power consumption due to excessively high drain voltage of the PA caused by increasing the drain voltage of the PA is avoided. In other words, in this method, the power consumption of the PA is also reduced to a maximum extent.

A second aspect of this application provides a device for reducing power consumption of a PA, where the device for reducing the power consumption of the PA includes the PA, and the device for reducing the power consumption of the PA in this application may include a receiving unit and a regulation unit. The receiving unit is configured to receive a first link status indication from a station B, where the first link status indication includes a parameter of a status of a link from the device for reducing the power consumption of the PA to the station B. The regulation unit is configured to: if the parameter included in the first link status indication is greater than a first threshold, decrease a drain voltage of the PA, to reduce the power consumption of the PA.

With reference to the second aspect, in a possible implementation of this application, the first link status indication includes any one of an MSE, an EVM, and an SNR.

With reference to the second aspect and the foregoing possible implementation, in another possible implementation of this application, the receiving unit is further configured to receive a second link status indication from the station B, where the second link status indication includes the parameter of the status of the link from the device for reducing the power consumption of the PA to the station B. The device for reducing the power consumption of the PA in this application may further include a first stopping unit. The first stopping unit is configured to: if the parameter included in the second link status indication is less than the first threshold and greater than a second threshold, stop decreasing the drain voltage of the PA, where the second threshold is less than the first threshold.

With reference to the second aspect and the foregoing possible implementations, in another possible implementation of this application, the regulation unit is further configured to: if the parameter included in the first link status indication is less than a second threshold, increase the drain voltage of the PA, where the second threshold is less than the first threshold.

With reference to the second aspect and the foregoing possible implementations, in another possible implementation of this application, the receiving unit is further configured to receive a third link status indication from the station B, where the third link status indication includes the parameter of the status of the link from the device for reducing the power consumption of the PA to the station B. The device for reducing the power consumption of the PA in this application may further include a second stopping unit. The second stopping unit is configured to: if the parameter included in the third link status indication is greater than the second threshold and less than the first threshold, stop increasing the drain voltage of the PA.

It should be noted that functional units in the second aspect and the various possible implementations of the second aspect in this embodiment of the present invention are obtained after the device for reducing the power consumption of the PA is logically divided, to perform the method for reducing the power consumption of the PA in the first aspect and the various optional manners of the first aspect. For detailed descriptions and beneficial effect analysis of the functional units in the second aspect and the various possible implementations of the second aspect, refer to the corresponding descriptions and technical effects in the first aspect and the various possible implementations of the first aspect. Details are not described herein again.

A third aspect of this application provides a device for reducing power consumption of a PA, where the device for reducing the power consumption of the PA may include a processor, a memory, and a communications interface. The memory is configured to store a computer executable instruction, the processor, the communications interface, and the memory are connected by using a bus, and when the device for reducing the power consumption of the PA is run, the processor executes the computer executable instruction stored in the memory, the device for reducing the power consumption of the PA is enabled to perform the method for reducing the power consumption of the PA in the first aspect and the various optional manners of the first aspect.

A fourth aspect of this application provides a computer storage medium, where the computer storage medium stores one or more pieces of program code. When the processor of the device for reducing the power consumption of the PA in the third aspect executes the program code, the device for reducing the power consumption of the PA performs the method for reducing the power consumption of the PA in the first aspect and the various optional manners of the first aspect.

A fifth aspect of this application provides a computer program product. When the computer program product is run on a computer, the computer is enabled to perform the method for reducing the power consumption of the PA in the first aspect and the various optional manners of the first aspect.

For detailed descriptions of the modules of the device for reducing the power consumption of the PA in the third aspect and corresponding technical effect analysis, refer to detailed descriptions in the first aspect and the various possible implementations of the first aspect. Details are not described again in this embodiment of the present invention.

DESCRIPTION OF EMBODIMENTS

In the specification and claims in the embodiments of the present invention, the terms "first", "second", and so on are intended to distinguish between different objects but do not indicate a particular order of the objects. For example, a first link status indication, a second link status indication, and the like are used to distinguish different link status indications, but are not used to describe a particular order of a link status indication.

The term "example", "for example", or the like in the embodiments of the present invention is used to represent giving an example, an illustration, or a description. Any embodiment or design solution described as "example" or "for example" in the embodiments of the present invention should not be explained as being more preferred or having more advantages than another embodiment or design solution. Exactly, use of the word "example", "for example", or the like is intended to present a related concept in a specific manner.

The following explains some concepts in a method and a device for reducing power consumption of a PA that are provided in the embodiments of the present invention.

A link status indication is a type of information that feeds back quality of a point-to-point link status. The information includes a parameter of the link status. A larger parameter of the link status indicates better quality of the link status.

A mean square error (MSE) is a type of parameters of a link status. The mean square error is a convenient algorithm for measuring a "mean error" and can be used to evaluate a change degree of a signal, namely, quality of the link status during signal transmission.

An error vector magnitude (EVM) is a type of parameters of a link status. The error vector magnitude is a modulation quality test item and refers to a vector difference between an actual signal and an ideal signal. The EVM can reflect signal quality by measuring an error vector.

A signal-to-noise ratio (SNR) is a type of parameters of a link status. The signal-to-noise ratio is a parameter used to describe a ratio of a valid signal power to a noise power in a signal and is expressed in dB. For example, a higher signal-to-noise ratio value indicates better link status quality.

To resolve a power consumption wasting problem caused by a limited reduction amplitude of the power consumption of the PA and individual differences between batches of components, the embodiments of the present invention provide a method and a device for reducing power consumption of a PA. A station A may decrease a drain voltage of the PA of a radio frequency module of the station A based on the link status indication, to reduce the power consumption of the PA.

The method and the device for reducing the power consumption of the PA provided in the embodiments of the present invention may be applied to a wireless communications system between point-to-point radio frequency modules, specifically, may be applied to a process of decreasing the drain voltage of the PA to reduce the power consumption of the PA of the radio frequency module during wireless communication between the radio frequency modules.

It should be noted that the embodiments of the present invention are applicable to a point-to-point communications system, for example, a communications system between the station A and a station B, or a communications system between the station A and a base station. In the embodiments of the present invention, only the communications system established between the station A and the station B is used as an example to describe the method and the device for reducing the power consumption of the PA. For example, the device for reducing the power consumption of the PA in the embodiments of the present invention is the station A.

Figure 1:
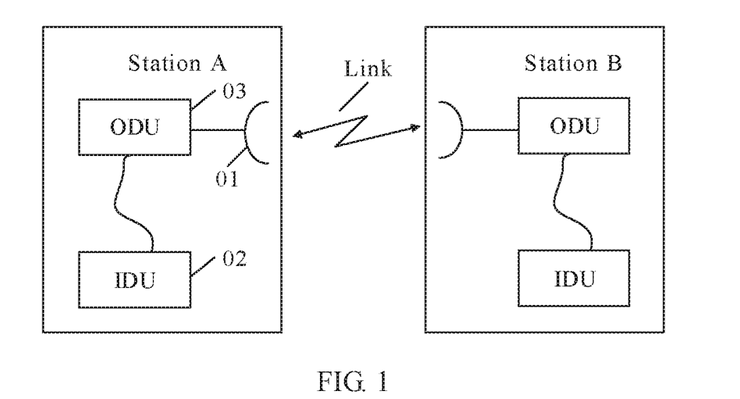
FIG. 1 is a schematic architectural diagram of a communications system according to an embodiment of the present invention.

A method for reducing power consumption of a PA provided in an embodiment of the present invention may be applied to a wireless communications system between point-to-point radio frequency modules. FIG. 1 is a schematic architectural diagram of a communications system according to an embodiment of the present invention. As shown in FIG. 1, the communications system may include a station A and a station B. The station A and the station B may establish a link connection by using an air interface, to perform signal transmission.

As shown in FIG. 1, the station A includes an antenna 01, an indoor unit (IDU) 02, and an outdoor unit (ODU) 03. The IDU 02 and the ODU 03 are connected by using a cable. The station B includes an antenna, an IDU, and an ODU.

The antenna 01 is a sending/receiving unit of the station A. and may be configured to send a signal to the station B, and receive a signal sent by the station B.

For example, in this embodiment of the present invention, after the station A sends the signal to the station B by using the antenna 01, the station B returns a link status indication to the station A based on the received signal. The station A receives the link status indication by using the antenna 01, and transmits the link status indication to the IDU 02 by using the ODU 03.

The IDU 02 is an indoor unit of the station A. and mainly includes an intermediate frequency part and a baseband part. The intermediate frequency part is mainly responsible for receiving and sending an analog signal. The baseband part is mainly responsible for demodulating and digitizing a received signal and decomposing the received signal to obtain a needed signal. In addition, the baseband part may also modulate and convert a digital signal to obtain a low-frequency analog signal, and transmit the low-frequency analog signal to the ODU 03 by using the intermediate frequency part.

For example, in this embodiment of the present invention, the IDU 02 may be configured to receive the link status indication transmitted by the antenna 01 by using the ODU 03, and send a voltage regulation command (for example, a voltage decrease command and a voltage increase command) to the ODU 03 based on the link status indication.

The ODU 03 is an outdoor unit of the station A, and is configured to transmit/receive a signal by using the antenna 01. In addition, the ODU 03 may receive a command transmitted by the IDU 02, and process the signal based on the command.

Figure 2:
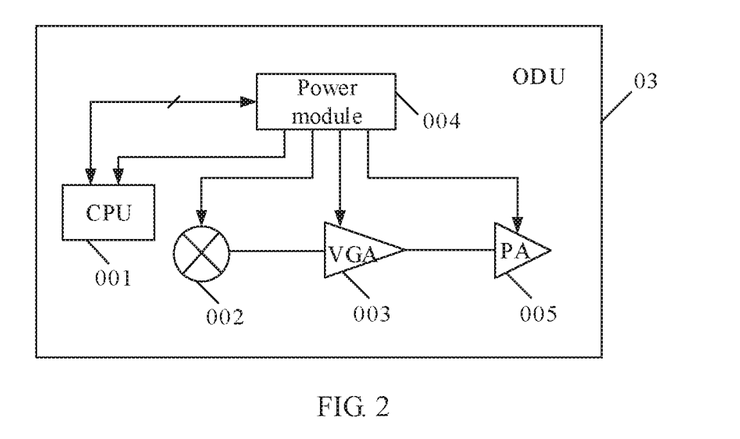
FIG. 2 is a schematic structural diagram of an ODU according to an embodiment of the present invention.

Specifically, in this embodiment of the present invention, the ODU 03 is a radio frequency module of the station A, and the ODU 03 includes the PA. As shown in FIG. 2, the ODU 03 may include a central processing unit (CPU) 001, a frequency converter 002, a variable gain amplifier (VGA) 003, a power module 004 and a PA 005. The CPU 001 may be connected to the power module 004 by using cables. Both the CPU 001 and the frequency converter 002 may be connected to the IDU 02 by using cables (not shown in the figure). The frequency converter 002, the VGA 003, the power module 004 and the PA 005 are connected by using cables. The PA 005 may be connected to the antenna 01 by using a cable (not shown in the figure).

The CPU 001 is a control center of the ODU 03, and may be responsible for status monitoring (for example, a voltage, a current, and temperature), may adjust a transmit power based on a current status (for example, a status that affects link quality such as weather and environment), may control voltage regulation of the power supply module 004, and may communicate with the IDU 02 and process the received command. For example, the CPU 001 may receive the voltage regulation command sent by the IDU 02, and parse and process the voltage regulation command.

The frequency converter 002 is a signal frequency conversion unit, which up-converts the low-frequency analog signal sent by the IDU 02 to a microwave frequency band, so that a signal can be transmitted from the antenna of a device radiated by the antenna by reaching a proper signal frequency.

The VGA 003 is a device for adjusting strength of a signal. Generally, the station A includes a multi-level amplification circuit (for example, the VGA 003 and the PA 005).

The power supply module 004 may supply power to each module or unit in the ODU 03 (for example, supply power to the PA), and a voltage of the power supply module 004 is programmable.

The PA 005 is an amplification circuit that can output a high-power signal, which may amplify a power of a signal, so that a transmit power of an output end can be increased, thereby adjusting a coverage area of the signal.

Figure 3:
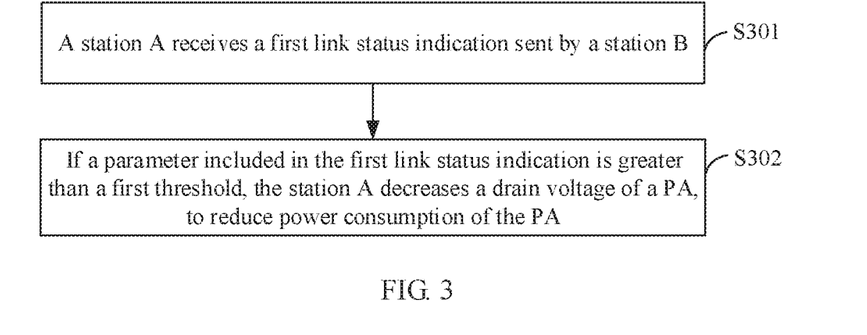
FIG. 3 is a flowchart 1 of a method for reducing power consumption of a PA according to an embodiment of the present invention.

Based on the communications system shown in FIG. 1 and the modules or components of the ODU 03 in FIG. 2, an embodiment of the present invention provides a method for reducing power consumption of a PA. The method describes in detail a process of decreasing a drain voltage of the PA to reduce the power consumption of the PA of the radio frequency module. Specifically, as shown in FIG. 3, the method for reducing the power consumption of the PA may include S301 and S302.

S301. The station A receives a first link status indication sent by the station B.

The first link status indication includes a parameter of a status of a link from the station A to the station B. The first link status indication is a type of information for feeding back quality of a point-to-point link status (for example, from the station A to the station B). A larger value of the parameter included in the first link status indication indicates better quality of the link status.

In this embodiment of the present invention, the station A may exchange information with the station B after being communicatively connected to the station B. Specifically, the ODU 03 of the station A may send a signal to the station B by using the antenna 01. The station B parses and processes the received signal, obtains the parameter of the first link status indication based on a parsing result, and then transmits the parameter of the first link status indication to the IDU 02 of the station A in a form of information (for example, the first link status indication).

For example, a specific implementation in which the station A receives the first link status indication sent by the station B may be as follows: The IDU 02 of the station A may modulate the signal to obtain a low-frequency analog signal, and transmit the low-frequency analog signal to the ODU 03. The frequency converter 002 in the ODU 03 converts a frequency of the signal to obtain a high-frequency signal, and the VGA 003 in the ODU 03 adjusts a signal amplitude. The CPU 001 in the ODU 03 determines link configuration information (for example, a transmit power and a bandwidth) based on a current status (for example, a status such as weather or an environment that affects link quality), and sends the amplified high-frequency signal to the station B in the determined link configuration information by using the antenna 01. After receiving the signal sent by the station A, the station B parses and processes the signal, and obtains the parameter of the first link status indication based on a parsing result, and then transmits the parameter of the first link status indication to the station A in a form of information (for example, the first link status indication). The antenna 01 of the station A receives the first link status indication, and transmits the first link status indication to the IDU 02 by using the ODU 03.

For example, when the station B returns information to the station A, the information includes service information and non-service information. The non-service information includes network management information, control information, monitoring information, alarm information, and the like, and the network management information includes the first link status indication.

For example, the first link status indication in this embodiment of the present invention may include any one of an MSE, an EVM, and an SNR. The any one of the MSE, the EVM, and the SNR may represent the quality of the link status during signal transmission.

S302. If the parameter included in the first link status indication is greater than a first threshold, the station A decreases the drain voltage of the PA, to reduce the power consumption of the PA.

The first threshold is a preset threshold (namely, a voltage regulation determining threshold) used to determine whether to regulate a voltage. When the parameter included in the first link status indication is greater than the first threshold, it indicates that the quality of the link status during signal transmission is relatively good. In this case, if the drain voltage of the PA is decreased, normal signal transmission can still be ensured.

For example, herein, only an example in which the parameter included in the first link status indication is the MSE is used to describe a process in which the station A decreases the drain voltage of the PA. Specifically, after receiving the first link status indication, the IDU 02 of the station A determines whether the parameter MSE included in the first link status indication is greater than the first threshold. If the IDU 02 determines that the MSE is greater than the first threshold, the IDU 02 delivers a voltage decrease command to the CPU 001 in the ODU 03. After receiving the voltage decrease command, the CPU 001 parses and processes the voltage decrease command, and then controls the power module 004 to decrease a reference voltage of the power module 004, to decrease a drain voltage of the PA 005 (namely, a supply voltage of the PA 005). The amplitude value of the drain voltage of the PA 005 that is decreased each time is preset by the station A.

For example, it is assumed that a current drain voltage of the PA 005 in the station A is 6 V, and the first threshold preset by the station A is 8, the amplitude value of the drain voltage of the PA 005 that is decreased each time and that is preset by the station A is 0.05 V. If the parameter included in the first link status indication received by the IDU 02 of the station A is 9, the IDU 02 determines that the parameter included in the first link status indication is greater than the first threshold, and the IDU 02 delivers the voltage decrease command to the CPU 001. After receiving the voltage decrease command, the CPU 001 parses and processes the voltage decrease command, and then controls the power module 004 to decrease the drain voltage of the PA 005 to 6 V minus 0.05 V (namely, 5.95 V).

In the prior art, only drain currents of transmit powers of three levels of a PA are set, and a drain voltage of the PA is not regulated. Therefore, reduction in power consumption of the PA is limited. However, in this embodiment of the present invention, for components of different batches at each transmit power, the drain voltage of the PA may be decreased to a maximum extent by using a link status indication, to reduce the power consumption of the PA to a maximum extent.

For example, in the prior art, for PAs of different batches, 800 mA of a drain current is needed for a PA with relatively good performance to work normally, and 1000 mA of a drain current is needed for a PA with relatively poor performance to work normally. To ensure reliability of a communications system, a drain current provided by a power module is 1000 mA. In this case, for the PA with relatively good performance, drain current redundancy and unnecessary power consumption are caused.

However, in this embodiment of the present invention, at each transmit power, individual differences between batches of components do not need to be considered, provided that a link status of a communications system is monitored in real time, and the drain voltage of the PA is decreased based on the first link status indication, so that the power consumption of the PA may further be reduced on the premise that reliability of the communications system is ensured.

Figure 4A:
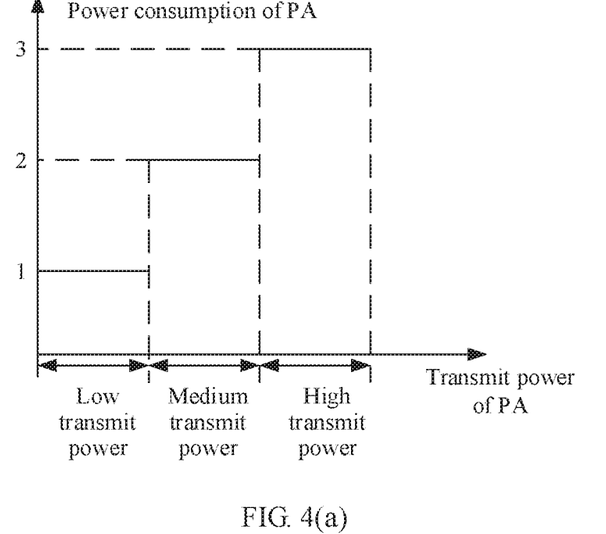
FIG. 4(a) is a schematic diagram of an example of a relationship between transmit powers of three levels of a PA and power consumption of the PA in the prior art.

For example, FIG. 4(*a*) is a schematic diagram of an example of a relationship between transmit powers of three levels of a PA and power consumption of the PA in the prior art. The power consumption of the PA is 1 at a low transmit power in the three levels of the PA, the power consumption of the PA is 2 at a medium transmit power in the three levels of the PA, and the power consumption of the PA is 3 at a high transmit power in the three levels of the PA.

Figure 4B:
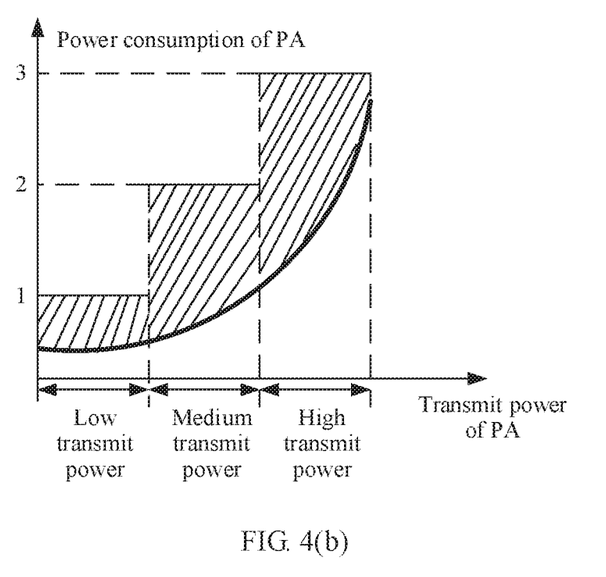
FIG. 4(b) is a schematic diagram of an effect of a method for reducing power consumption of a PA according to an embodiment of the present invention.

FIG. 4(*b*) is a schematic diagram of an effect of a method for reducing power consumption of a PA according to an embodiment of the present invention. A thick curve in FIG. 4(*b*) indicates a relationship between each transmit power and the power consumption of the PA in this embodiment of the present invention.

It can be learned from FIG. 4(*b*) that, at a same transmit power, the power consumption of the PA in this embodiment of the present invention is less than the power consumption of the PA in the prior art, and a shaded part in FIG. 4(*b*) is an amplitude of reducing the power consumption of the PA in this embodiment of the present invention. Therefore, according to the method for reducing the power consumption of the PA provided in this embodiment of the present invention, the power consumption of the PA is further reduced.

This embodiment of the present invention provides the method for reducing power consumption of the PA. The station A may decrease the drain voltage of the PA based on the received first link status indication, to reduce the power consumption of the PA. The first link status indication is used to represent the quality of the link status, and when the parameter included in the first link status indication is greater than the first threshold, the station A decreases the drain voltage of the PA, so that the power consumption of the PA may further be reduced when the reliability of the communications system is ensured. In addition, the station A may monitor the link status of the communications system in real time, and therefore when the reliability of the communications system is ensured, and for the components of different batches at different transmit powers, the station A may decrease the drain voltage of the PA to a maximum extent, to reduce the power consumption of the PA to a maximum extent by using the link status monitored in real time.

Figure 5:
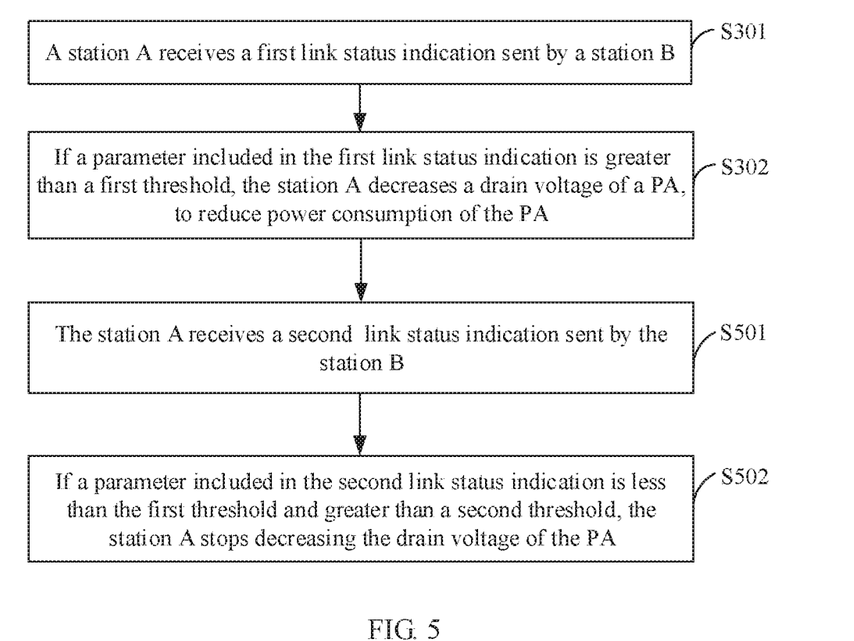
FIG. 5 is a flowchart 2 of a method for reducing power consumption of a PA according to an embodiment of the present invention.

Certainly, in this embodiment of the present invention, the station A may periodically receive the link status indication sent by the station B, to monitor the quality of the status of the link from the station A to the station B in real time. The station A may determine, based on the periodically received link status indication, whether to continue to decrease the drain voltage of the PA. Specifically. FIG. 5 shows another method for reducing power consumption of a PA according to an embodiment of the present invention. Compared with the method for reducing the power consumption of the PA shown in FIG. 3, a main difference is that S501 and S502 are added after S302, only differences are described in detail herein. Referring to FIG. 5, the method for reducing the power consumption of the PA includes the following steps.

S301. A station A receives a first link status indication sent by a station B.

The first link status indication includes a parameter of a status of a link from the station A to the station B.

S302. If the parameter included in the first link status indication is greater than a first threshold, the station A decreases a drain voltage of the PA, to reduce the power consumption of the PA.

S501. The station A receives a second link status indication sent by the station B.

The second link status indication includes the parameter of the status of the link from the station A to the station B.

In this embodiment of the present invention, the station A may receive, when decreasing the drain voltage of the PA, the second link status indication sent by the station B, where the second link status indication is used to represent quality of the status of the link from the station A to the station B after the drain voltage of the PA is decreased.

For example, the second link status indication in this embodiment of the present invention may also include any one of an MSE, an EVM, and an SNR.

It should be noted that "a specific implementation in which the station A receives the second link status indication sent by the station B" is the same as "a specific implementation in which the station A receives the first link status indication sent by the station B". Reference may be made to specific descriptions in the foregoing embodiment, and details are not described herein again.

S502. If the parameter included in the second link status indication is less than the first threshold and greater than a second threshold, the station A stops decreasing the drain voltage of the PA.

The second threshold is less than the first threshold. The second threshold is a preset threshold (namely, a voltage regulation anti-jitter threshold) used to determine whether to continue to regulate a voltage. When the parameter included in the second link status indication is less than the second threshold, it indicates that the quality of the link status during signal transmission is relatively poor, and therefore normal signal transmission cannot be ensured.

In this embodiment of the present invention, the station A may periodically receive a link status indication sent by the station B. After a CPU 001 of the station A controls a power module 004, to decrease a drain voltage of a PA 005, an IDU 02 of the station A receives the second link status indication, and determine whether the parameter included in the second link status indication is less than the first threshold and greater than the second threshold. When the IDU 02 determines that the parameter included in the second link status indication is greater than the first threshold, the IDU 02 continues to send a voltage decrease command to the CPU 001. When the IDU 02 determines that the parameter included in the second link status indication is less than the first threshold and greater than the second threshold, the IDU 02 sends a voltage decrease stop command to the CPU 001.

For example, when the IDU 02 of the station A determines that the parameter included in the second link status indication is greater than the first threshold, the IDU 02 continues to send the voltage decrease command to the CPU 001, so that the CPU 001 controls the power module 004, to continue to decrease the drain voltage of the PA 005. In addition, the IDU 02 periodically receives the second link status indication, and determines whether the parameter included in the second link status indication is less than the first threshold and greater than the second threshold, and does not send the voltage decrease stop command to the CPU 001 until the IDU 02 determines that the parameter included in the received link status indication is less than the first threshold and greater than the second threshold. After receiving the voltage decrease stop command, the CPU 001 parses and processes the voltage decrease stop command, and then stops decreasing a voltage of the power module 004, to stop decreasing the drain voltage of the PA 005.

For example, it is assumed that the second threshold preset by the station A is 7. The CPU 001 of the station A controls the power module 004, to reduce the drain voltage of the PA 005 to 5.95 V. The IDU 02 of the station A periodically receives the second link status indication, and in this case, if the parameter included in the second link status indication is 8.5, and the IDU 02 determines that the parameter included in the second link status indication is greater than a first threshold 8, the IDU 02 continues to deliver the voltage decrease command to the CPU 001. After receiving the voltage decrease command, the CPU 001 parses and processes the voltage decrease command, and then controls the power module 004, to decrease the drain voltage of the PA 005 to 5.95 V minus 0.05 V (namely, 5.9 V). The IDU 02 of the station A periodically receives the second link status indication, and in this case, if the parameter included in the second link status indication is 7.5, and the IDU 02 determines that the parameter included in the second link status indication is less than the first threshold 8 and greater than the second threshold 7, the IDU 02 delivers the voltage decrease stop command to the CPU 001. After receiving the voltage decrease stop command, the CPU 001 parses and processes the voltage decrease stop command, and then stops decreasing the voltage of the power module 004, to stop decreasing the drain voltage of the PA 005.

The station A may monitor the quality of the link status in real time in a process of decreasing the drain voltage of the PA, so that the parameter included in the second link status indication is always between the first threshold and the second threshold. Therefore, the drain voltage of the PA may be decreased to a maximum extent, to reduce the power consumption of the PA to a maximum extent when reliability of a communications system is ensured.

It may be understood that, in components of different batches, for some components with relatively good performance, the station A decreases the drain voltage of the PA in a relatively large amplitude. However, for some components with relatively poor performance, the station A decreases the drain voltage of the PA in a relatively small amplitude.

It should be noted that, in this embodiment of the present invention, S501 and S302 are simultaneously performed.

Figure 6:
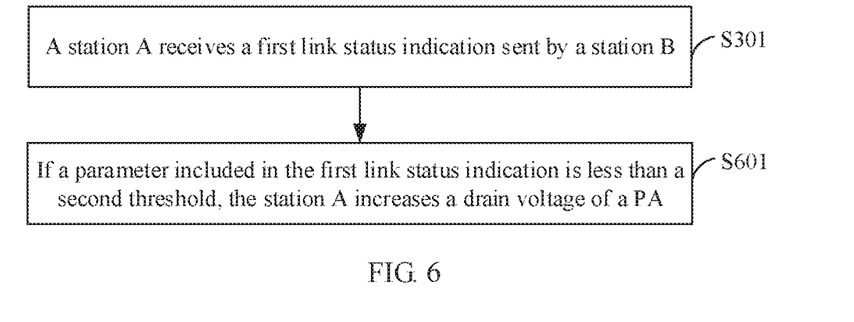
FIG. 6 is a flowchart 3 of a method for reducing power consumption of a PA according to an embodiment of the present invention.

Further, when the parameter included in the first link status indication received by the station A is less than the second threshold, it represents that the quality of the link status during signal transmission between the station A and the station B is relatively poor. To ensure normal signal transmission, the station A may increase the drain voltage of the PA. An embodiment of the present invention further provides a method for reducing power consumption of a PA. Specifically, as shown in FIG. 6, the method for reducing the power consumption of the PA includes the following steps.

S301. A station A receives a first link status indication sent by a station B.

The first link status indication includes a parameter of a status of a link from the station A to the station B.

S601. If the parameter included in the first link status indication is less than a second threshold, the station A increases a drain voltage of the PA.

The second threshold is less than the first threshold. When the parameter included in the first link status indication is less than the second threshold, it indicates that quality of the link status during signal transmission is relatively poor. To ensure normal signal transmission, the station A may increase the drain voltage of the PA, to improve reliability of a communications system.

For example, if the quality of the link status between the station A and the station B is relatively poor due to affection of weather, environment, or the like, the parameter included in the first link status indication sent by the station B to the station A is less than the second threshold.

In this embodiment of the present invention, after receiving the first link status indication, an IDU 02 of the station A determines whether the parameter included in the first link status indication is less than the second threshold. When the IDU 02 determines that the parameter included in the first link status indication is less than the second threshold, the IDU 02 delivers a voltage increase command to a CPU 001 in an ODU 03. After receiving the voltage increase command, the CPU 001 parses and processes the voltage increase command, and then controls a power module 004 to increase a reference voltage of the power module 004, to increase a drain voltage of a PA 005.

Figure 7:
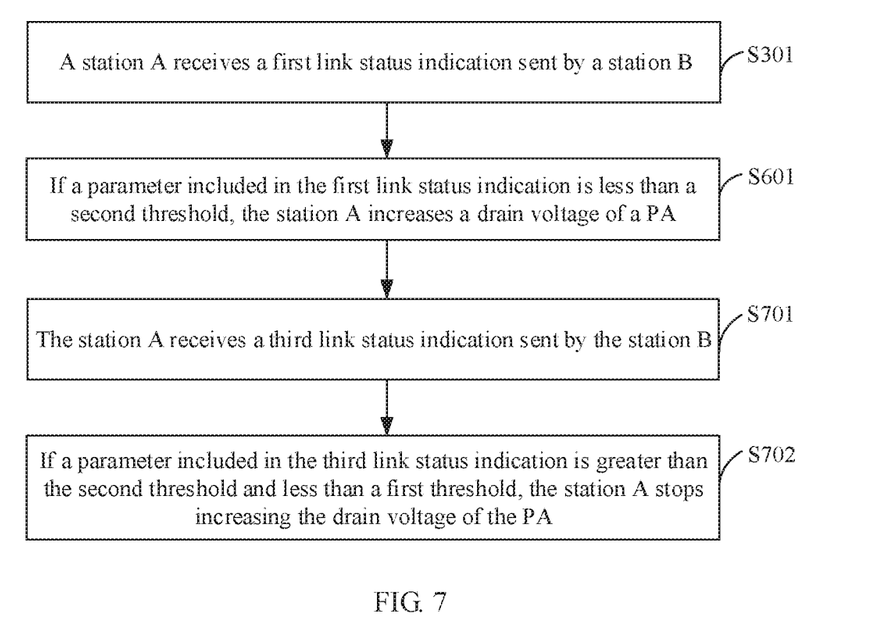
FIG. 7 is a flowchart 4 of a method for reducing power consumption of a PA according to an embodiment of the present invention.

Certainly, in this embodiment of the present invention, the station A may determine, based on a periodically received link status indication, whether to continue to increase the drain voltage of the PA. Specifically, FIG. 7 shows another method for reducing power consumption of a PA according to an embodiment of the present invention. Compared with the method for reducing the power consumption of the PA shown in FIG. 6, a main difference is that S701 and S702 are added after S601, only differences are described in detail herein. Referring to FIG. 7, the method for reducing the power consumption of the PA includes the following steps.

S301. A station A receives a first link status indication sent by a station B.

The first link status indication includes a parameter of a status of a link from the station A to the station B.

S601. If the parameter included in the first link status indication is less than a second threshold, the station A increases a drain voltage of the PA.

The second threshold is less than the first threshold.

S701. The station A receives a third link status indication sent by the station B.

The third link status indication includes the parameter of the status of the link from the station A to the station B.

In this embodiment of the present invention, the station A may receive, when decreasing the drain voltage of the PA, the third link status indication sent by the station B, where the third link status indication is used to represent quality of the status of the link from the station A to the station B after the drain voltage of the PA is increased.

For example, the third link status indication in this embodiment of the present invention may also include any one of an MSE, an EVM, and an SNR.

It should be noted that "a specific implementation in which the station A receives the third link status indication sent by the station B" is the same as "a specific implementation in which the station A receives the first link status indication sent by the station B". Reference may be made to specific descriptions in the foregoing embodiment, and details are not described herein again.

S702. If the parameter included in the third link status indication is greater than the second threshold and less than the first threshold, the station A stops increasing the drain voltage of the PA.

When the parameter included in the third link status indication is greater than the second threshold, it represents that after the station A increases the drain voltage of the PA, the quality of the link status between the station A and the station B is relatively good, and normal signal transmission can be performed. In this case, if the drain voltage of the PA continues to be increased, the power consumption of the PA increases.

In this embodiment of the present invention, when a CPU 001 of the station A controls a power module 004, to increase a drain voltage of a PA 005, an IDU 02 of the station A receives the third link status indication, and determines whether the parameter included in the third link status indication is greater than the second threshold and less than the first threshold. When the IDU 02 determines that the parameter included in the third link status indication is greater than the second threshold and less than the first threshold, the IDU 02 sends a voltage increase stop command to the CPU 001. After receiving the voltage increase stop command, the CPU 001 parses and processes the voltage increase stop command, and then stops increasing a voltage of the power module 004, to stop increasing the drain voltage of the PA 005.

After the station A increases the drain voltage of the PA, the parameter included in the third link status indication is greater than the second threshold and less than the first threshold. Therefore, in this method provided in this embodiment of the present invention, not only the reliability of the communications system is ensured, but also a problem of excessive power consumption due to excessively high drain voltage of the PA caused by increasing the drain voltage of the PA is avoided. In other words, in this method, the power consumption of the PA is also reduced to a maximum extent.

It should be noted that, in this embodiment of the present invention, S601 and S701 are simultaneously performed.

The foregoing mainly describes the solutions provided in the embodiments of the present invention from perspectives of a device for reducing power consumption of a PA. It can be understood that, to implement the foregoing functions, the device for reducing the power consumption of the PA includes a corresponding hardware structure and/or software module for implementing each function. A person skilled in the art should be easily aware that, the device for reducing the power consumption of the PA and algorithm steps in each example described with reference to the embodiments disclosed in this specification can be implemented in a form of hardware or a combination of hardware and computer software in the present invention. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of the present invention.

In the embodiments of the present invention, functional module division or functional units division may be performed on the device for reducing the power consumption of the PA based on the foregoing method example, for example, each functional module or functional unit may be divided corresponding to each function, or two or more functions may be integrated into one processing module. The integrated module may be implemented in a form of hardware, or may be implemented in a form of a software functional module or functional unit. The module or unit division in the embodiments of the present invention is an example, and is merely logical function division. There may be other division manners in actual implementation.

Figure 8:
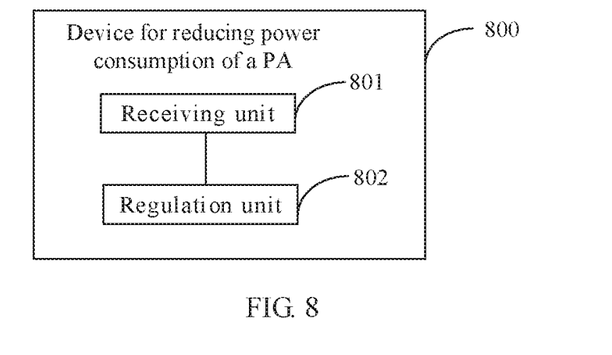
FIG. 8 is schematic structural diagram 1 of a device for reducing power consumption of a PA according to an embodiment of the present invention.

FIG. 8 is a possible schematic structural diagram of the device for reducing the power consumption of the PA in the foregoing embodiments. A device 800 for reducing power consumption of a PA may include a receiving unit 801 and a regulation unit 802.

A function of the receiving unit 801 may be implemented by using the antenna 01 shown in FIG. 1. A function of the regulation unit 802 may be implemented by using the ODU 03 shown in FIG. 1, and specifically, may be implemented by using the CPU 001 in the ODU 03 shown in FIG. 2.

The receiving module 801 is configured to support S301, S501, and S701 in the foregoing embodiments and/or is configured to perform another process in the technology described in this specification. The regulation unit 802 is configured to support S302 and S601 in the foregoing embodiments and/or is configured to perform another process in the technology described in this specification.

Figure 9:
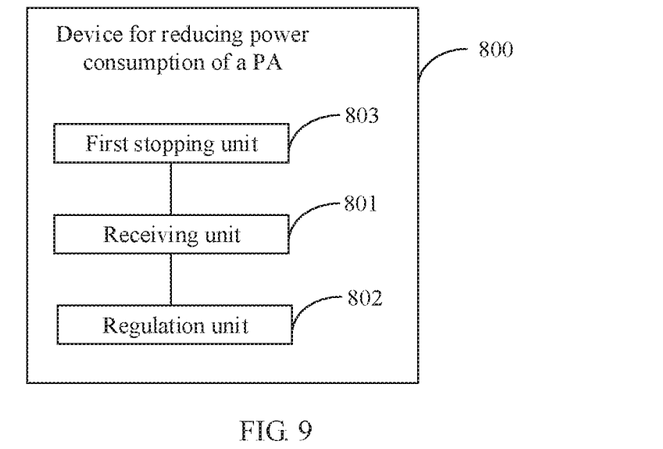
FIG. 9 is schematic structural diagram 2 of a device for reducing power consumption of a PA according to an embodiment of the present invention.

Further, as shown in FIG. 9, the device 800 for reducing the power consumption of the PA shown in FIG. 8 may further include a first stopping unit 803. A function of the first stopping unit 803 may be implemented by using the ODU 03 shown in FIG. 1, and specifically, may be implemented by using the CPU 001 in the ODU 03 shown in FIG. 2.

The first stopping unit 803 is configured to support S502 in the foregoing embodiment, and/or is configured to perform another process of the technology described in this specification.

Figure 10:
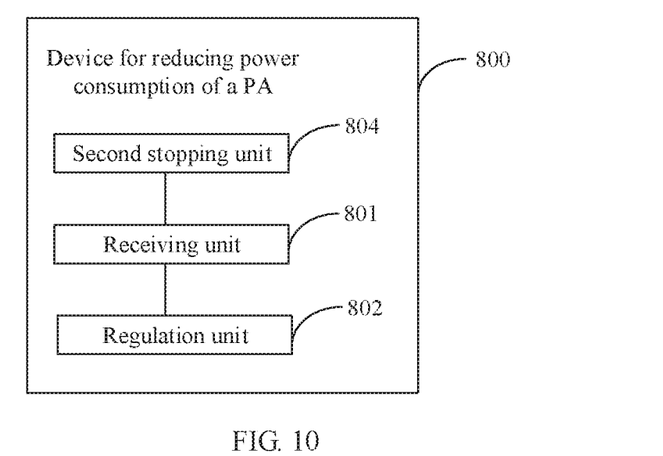
FIG. 10 is schematic structural diagram 3 of a device for reducing power consumption of a PA according to an embodiment of the present invention.

Further, as shown in FIG. 10, the device 800 for reducing the power consumption of the PA shown in FIG. 8 may further include a second stopping unit 804. A function of second stopping unit 804 may be implemented by using the ODU 03 shown in FIG. 1, and specifically, may be implemented by using the CPU 001 in the ODU 03 shown in FIG. 2.

The second stopping unit 804 is configured to support S702 in the foregoing embodiment, and/or is configured to perform another process of the technology described in this specification.

Certainly, the device 80X) for reducing the power consumption of the PA provided in an embodiment of the present invention includes but is not limited to the foregoing modules. For example, the device 800 for reducing the power consumption of the PA may further include a storage unit and a sending unit. For example, the storage unit may be configured to store a first link status indication. The sending unit may be configured to send a signal to a station B.

A function of the sending unit may be implemented by using the antenna 01 shown in FIG. 1.

When an integrated unit is used, the regulation unit 802, the first stopping unit 803, the second stopping unit 804, and the like may be integrated into one processing module for implementation, and the processing module may be a processor or a controller. For example, the processing module may be a CPU 001, a general purpose processor, a digital signal processor (DSP), an application-specific integrated circuit (ASIC), a field programmable gate array (FPGA) or another programmable logic device, a transistor logic device, a hardware component, or any combination thereof. The processing module may implement or execute various example logical blocks, modules, and circuits described with reference to content disclosed in the present invention. The processing module may also be a combination of processors implementing a computing function, for example, a combination of one or more microprocessors or a combination of a DSP and a microprocessor. The receiving unit 801 and the sending unit may be integrated into one communications module for implementation. The communications module may be a communications interface. The storage unit may be a memory.

Figure 11:
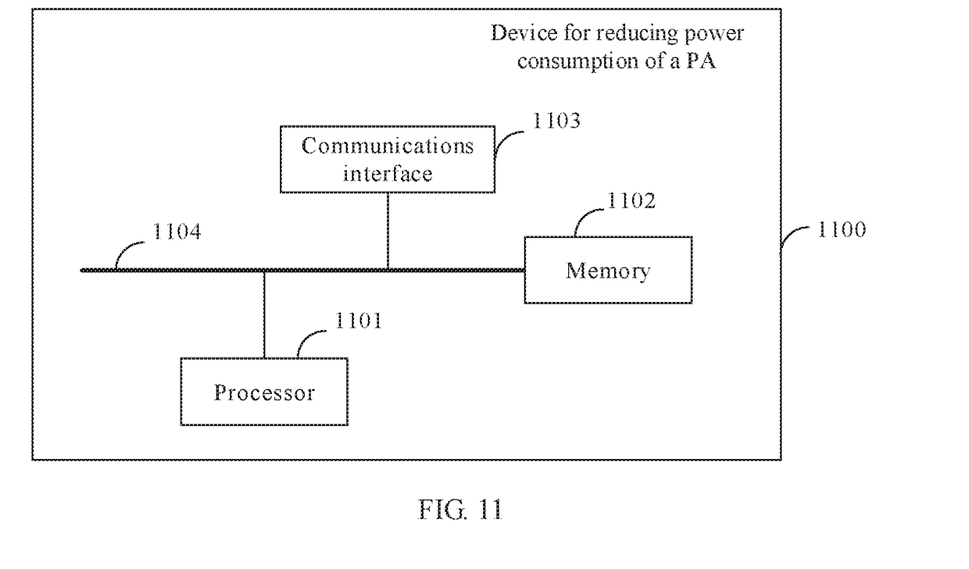
FIG. 11 is schematic structural diagram 4 of a device for reducing power consumption of a PA according to an embodiment of the present invention.

When the processing module is a processor, the storage unit is a memory, and the communications module is a transceiver, the device 800 for reducing the power consumption of the PA in this embodiment of the present invention may be a device 1100 for reducing power consumption of a PA shown in FIG. 11. As shown in FIG. 11, the device 1100 for reducing the power consumption of the PA includes a processor 1101, a memory 1102, and a communications interface 1103. The processor 1101, the memory 1102, and the communications interface 1103 are connected to each other by using a bus 1104.

The processor 1101 may be the CPU 001 in the ODU 03 shown in FIG. 2. The communications interface 1103 may be the antenna 01 shown in FIG. 1.

The bus 1104 may be a peripheral component interconnect (PCI) bus, an extended industry standard architecture (EISA) bus, or the like. The bus 1104 may be classified into an address bus, a data bus, a control bus, and the like. For ease of representation, only one thick line is used to represent the bus 1104 in FIG. 11, but this does not mean that there is only one bus or only one type of bus.

The device 1100 for reducing the power consumption of the PA may include one or more processors 1101. In other words, the device 1100 for reducing the power consumption of the PA may include a multi-core processor.

An embodiment of the present invention further provides a computer storage medium. The computer storage medium stores one or more pieces of program code. When a device 1100 for reducing power consumption of a PA executes the program code, the device 1100 for reducing the power consumption of the PA performs a related method step in any one of the accompanying drawings in FIG. 3, and FIG. 5 to FIG. 7.

For detailed descriptions of the modules in the device 1100 for reducing the power consumption of the PA provided in this embodiment of the present invention and technical effects brought after the modules or units perform the related method step in any one of FIG. 3, and FIG. 5 to FIG. 7, refer to the related descriptions in the method embodiment of the present invention. Details are not described herein again.

An embodiment of the present invention further provides a computer program product. When the computer program product is run on a computer, the computer is enabled to perform a related method step in any one of the accompanying drawings in FIG. 3, and FIG. 5 to FIG. 7.

The device 800 for reducing the power consumption of the PA, the device 1100 for reducing the power consumption of the PA, the computer storage medium, or the computer program product provided in the embodiments of the present invention is configured to perform a corresponding method provided above. Therefore, for beneficial effects that can be achieved by the device 800 for reducing the power consumption of the PA, the device 1100 for reducing the power consumption of the PA, the computer storage medium, or the computer program product, refer to beneficial effects in the corresponding method provided above. Details are not described herein again.

The foregoing descriptions about implementations allow a person skilled in the art to understand that, for the purpose of convenient and brief description, division of the foregoing functional modules is used as an example for illustration. In actual application, the foregoing functions may be allocated to different functional modules and implemented as required, in other words, an inner structure of an apparatus is divided into different functional modules to implement all or some of the functions described above. For a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in other manners. For example, the described apparatus embodiment is merely an example. For example, the module or unit division is merely logical function division, and there may be another division manner during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, and may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units may be integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to the prior art, or all or some of the technical solutions may be implemented in a form of a software product. The computer software product is stored in a storage medium and includes several instructions for instructing a computer device (which may be a personal computer, a server, a network device, or the like) or a processor to perform all or some of the steps of the methods described in the embodiments of this application. The foregoing storage medium includes any medium that can store program code, such as a flash memory, a removable hard disk, a read-only memory, a random access memory, a magnetic disk, or an optical disc.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A method for reducing power consumption of a power amplifier (PA), wherein a station A comprises the PA, and the method comprises:
    receiving, by the station A, a first link status indication from a station B, wherein the first link status indication comprises a parameter of a status of a link from the station A to the station B; and
    in response to the parameter comprised in the first link status indication being greater than a first threshold, decreasing, by the station A, a drain voltage of the PA, to reduce the power consumption of the PA.

2. The method according to claim 1, wherein the first link status indication comprises any one of a mean square error (MSE), an error vector magnitude (EVM), and a signal-to-noise ratio (SNR).

3. The method according to claim 1, wherein the method further comprises:
    receiving, by the station A, a second link status indication from the station B, wherein the second link status indication comprises a second parameter of a second status of the link from the station A to the station B; and
    in response to the second parameter comprised in the second link status indication being less than the first threshold and greater than a second threshold, stopping decreasing, by the station A, the drain voltage of the PA, wherein the second threshold is less than the first threshold.

4. The method according to claim 1, wherein the method further comprises:
    receiving, by the station A, a second link status indication from the station B, wherein the second link status indication comprises a second parameter of a second status of the link from the station A to the station B; and
    in response to the second parameter comprised in the first link status indication being less than a second threshold, increasing, by the station A, the drain voltage of the PA, wherein the second threshold is less than the first threshold.

5. The method according to claim 4, wherein the method further comprises:
    receiving, by the station A, a third link status indication from the station B, wherein the third link status indication comprises a third parameter of a third status of the link from the station A to the station B; and
    in response to the third parameter comprised in the third link status indication being greater than the second threshold and less than the first threshold, stopping, by the station A, increasing the drain voltage of the PA.

6. A device for reducing power consumption of a power amplifier (PA), wherein the device for reducing the power consumption of the PA comprises the PA, and the device for reducing the power consumption of the PA comprises:
    a receiver, configured to receive a first link status indication from a station B, wherein the first link status indication comprises a parameter of a status of a link from the device for reducing the power consumption of the PA to the station B; and
    a regulator, configured to: in response to the parameter comprised in the first link status indication being greater than a first threshold, decrease a drain voltage of the PA, to reduce the power consumption of the PA.

7. The device according to claim 6, wherein the first link status indication comprises any one of a mean square error (MSE), an error vector magnitude (EVM), and a signal-to-noise ratio (SNR).

8. The device according to claim 6, wherein the receiver is further configured to receive a second link status indication from the station B, wherein the second link status indication comprises a second parameter of a second status of the link from the device for reducing the power consumption of the PA to the station B; and
    the regulator is configured to: in response to the second parameter comprised in the second link status indication being less than the first threshold and greater than a second threshold, stop decreasing the drain voltage of the PA, wherein the second threshold is less than the first threshold.

9. The device according to claim 6, wherein the receiver is configured to receive a second link status indication from the station B, wherein the second link status indication comprises a second parameter of a second status of the link from the device to the station B; and
    the regulator is further configured to: in response to the second parameter comprised in the first link status indication being less than a second threshold, increase the drain voltage of the PA, wherein the second threshold is less than the first threshold.

10. The device according to claim 9, wherein the receiver is further configured to receive a third link status indication from the station B, wherein the third link status indication comprises a third parameter of a third status of the link from the device for reducing the power consumption of the PA to the station B; and the regulator is configured to: in response to the third parameter comprised in the third link status indication being greater than the second threshold and less than the first threshold, stop increasing the drain voltage of the PA.

11. A device for reducing power consumption of a power amplifier (PA), wherein the device for reducing the power consumption of the PA comprises a processor, a memory, and a communications interface, wherein the memory is configured to store a computer executable instruction, the processor, the communications interface, and the memory are connected by using a bus, and when the device for reducing the power consumption of the PA is run, the processor executes the computer executable instruction stored in the memory, the device for reducing the power consumption of the PA is enabled to perform operations comprising:

receiving, by the device, a first link status indication from a station B, wherein the first link status indication comprises a parameter of a status of a link from the device to the station B; and in response to the parameter comprised in the first link status indication being greater than a first threshold, decreasing, by the device, a drain voltage of the PA, to reduce the power consumption of the PA.

12. A non-transitory computer readable storage medium storing computer instructions that when executed by one or more hardware processors, cause the one or more hardware processors to perform operations comprising:

receiving, by a station A, a first link status indication from a station B, wherein the first link status indication comprises a parameter of a status of a link from the station A to the station B, wherein the station A comprises a power amplifier (PA); and in response to the parameter comprised in the first link status indication being greater than a first threshold, decreasing, by the station A, a drain voltage of the PA, to reduce a power consumption of the PA.

13. The non-transitory computer readable storage medium according to claim 12, wherein the first link status indication comprises one of a mean square error (MSE), an error vector magnitude (EVM), and a signal-to-noise ratio (SNR).

14. The non-transitory computer readable storage medium according to claim 12, wherein the operations further comprise:

receiving, by the station A, a second link status indication from the station B, wherein the second link status indication comprises the parameter of the status of the link from the station A to the station B; and when the parameter comprised in the second link status indication is less than the first threshold and greater than a second threshold, stopping decreasing, by the station A, the drain voltage of the PA, wherein the second threshold is less than the first threshold.

15. The non-transitory computer readable storage medium according to claim 12, wherein the operations further comprise:

when the parameter comprised in the first link status indication is less than a second threshold, increasing, by the station A, the drain voltage of the PA, wherein the second threshold is less than the first threshold.

16. The non-transitory computer readable storage medium according to claim 15, wherein the operations further comprise:

receiving, by the station A, a third link status indication from the station B, wherein the third link status indication comprises the parameter of the status of the link from the station A to the station B; and when the parameter comprised in the third link status indication is greater than the second threshold and less than the first threshold, stopping, by the station A, increasing the drain voltage of the PA.

* * * * *